(12) United States Patent
Wu et al.

(10) Patent No.: US 12,213,309 B2
(45) Date of Patent: Jan. 28, 2025

(54) SEMICONDUCTOR DEVICE AND MANUFACTURING METHOD THEREOF

(71) Applicant: CHANGXIN MEMORY TECHNOLOGIES, INC., Hefei (CN)

(72) Inventors: Gongyi Wu, Hefei (CN); Yong Lu, Hefei (CN); Xin Xin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 622 days.

(21) Appl. No.: 17/439,054

(22) PCT Filed: Jun. 15, 2021

(86) PCT No.: PCT/CN2021/100138
§ 371 (c)(1),
(2) Date: Sep. 14, 2021

(87) PCT Pub. No.: WO2022/077940
PCT Pub. Date: Apr. 21, 2022

(65) Prior Publication Data
US 2023/0054358 A1   Feb. 23, 2023

(30) Foreign Application Priority Data
Oct. 15, 2020  (CN) .......................... 202011100761.6

(51) Int. Cl.
*H10B 12/00* (2023.01)
*H01L 21/762* (2006.01)
(Continued)

(52) U.S. Cl.
CPC ..... *H10B 12/488* (2023.02); *H01L 21/76224* (2013.01); *H01L 23/5283* (2013.01);
(Continued)

(58) Field of Classification Search
CPC ......... H01L 29/0611–063; H10B 12/482–485; H10B 12/488
See application file for complete search history.

(56) References Cited

U.S. PATENT DOCUMENTS

| 6,455,886 B1 | 9/2002 | Mandelman et al. |
| 6,541,810 B2 | 4/2003 | Divakaruni et al. |

(Continued)

FOREIGN PATENT DOCUMENTS

| CN | 101197375 A | 6/2008 |
| CN | 102201410 A | 9/2011 |

(Continued)

OTHER PUBLICATIONS

English Translation of JP 2003188376A . Translation on Jul. 17, 2024. (Year: 2024).*

(Continued)

*Primary Examiner* — Amar Movva
(74) *Attorney, Agent, or Firm* — Syncoda LLC; Feng Ma (57) ABSTRACT

The present disclosure provides a semiconductor device and a manufacturing method thereof. The method for manufacturing a semiconductor device includes: providing a semiconductor substrate, with a plurality of trench isolation structures and a plurality of functional regions between the trench isolation structures being formed; forming a buried bit line structure, the buried bit line structure being formed in the semiconductor substrate; and forming a word line structure and a plurality of active regions, the word line structures and the active regions being formed on a surface of the semiconductor substrate and located above the functional regions.

12 Claims, 11 Drawing Sheets

(51) Int. Cl.
   *H01L 23/528*   (2006.01)
   *H01L 23/532*   (2006.01)
   *H01L 29/06*    (2006.01)
   *H01L 29/08*    (2006.01)

(52) U.S. Cl.
   CPC .... *H01L 23/53271* (2013.01); *H01L 29/0607* (2013.01); *H01L 29/0847* (2013.01); *H10B 12/053* (2023.02); *H10B 12/34* (2023.02); *H10B 12/482* (2023.02); *H10B 12/485* (2023.02)

(56) References Cited

U.S. PATENT DOCUMENTS

| | | |
|---|---|---|
| 8,350,323 B2 | 1/2013 | Mikasa |
| 8,912,604 B2 | 12/2014 | Myung et al. |
| 9,070,584 B2 | 6/2015 | Surthi et al. |
| 9,859,284 B2 | 1/2018 | Wang |
| 2007/0049050 A1 | 3/2007 | Kakoschke et al. |
| 2011/0127605 A1 | 6/2011 | Kim |
| 2011/0233662 A1* | 9/2011 | Mikasa ............ H10B 12/34 257/330 |
| 2012/0018799 A1* | 1/2012 | Park ............... H10B 69/00 257/329 |

FOREIGN PATENT DOCUMENTS

| | | | |
|---|---|---|---|
| CN | 103681599 A | | 3/2014 |
| CN | 104183599 A | | 12/2014 |
| CN | 106992156 A | | 7/2017 |
| CN | 108878424 A | | 11/2018 |
| CN | 111048467 A | | 4/2020 |
| CN | 111463205 A | | 7/2020 |
| JP | 2003188376 A | * | 7/2003 |

OTHER PUBLICATIONS

International Search Report and Written Opinion cited in PCT/CN2021/101424 mailed Sep. 27, 2021, 10 pages.
International Search Report cited in PCT/CN2021/100138 mailed Sep. 6, 2021, 9 pages.

* cited by examiner

Provide a semiconductor substrate, the semiconductor substrate is formed with a plurality of trench isolation structures and a plurality of functional regions between the trench isolation structures being formed Form a buried bit line structure, the buried bit line structure is formed in the semiconductor substrate Form a word line structure and a plurality of active regions, the word line structure and the active regions are formed on a surface of the semiconductor substrate and located above the functional regions

SEMICONDUCTOR DEVICE AND MANUFACTURING METHOD THEREOF

CROSS-REFERENCE TO RELATED APPLICATIONS

The present disclosure claims the priority to Chinese Patent Application 202011100761.6, titled "SEMICONDUCTOR DEVICE AND MANUFACTURING METHOD THEREOF", filed on Oct. 15, 2020, which is incorporated herein by reference in its entirety.

TECHNICAL FIELD

The present disclosure relates to, but is not limited to, a semiconductor device and a manufacturing method thereof.

BACKGROUND

Existing Dynamic Random Access Memory (DRAM) is a commonly used semiconductor device in electronic equipment such as computers, and comprises a memory cell array for storing data and a peripheral circuit on the periphery of the memory cell array. Each memory cell in the memory cell array usually comprises a transistor and a storage node, and a plurality of memory cells are connected to form the memory cell array through word lines and bit lines. The voltage of the word line connected to a gate of the transistor can control the on and off of the transistor, so that the data information stored in the storage node may be read through the bit line, or the data information may be written into a capacitor.

As the density of transistors continues to increase, the sizes of word lines, bit lines, and isolation structures between different devices continue to decrease. On the one hand, the problem of parasitic capacitance between the bit lines and between the bit line and the storage node contact becomes increasingly serious, which will cause increasingly serious RC delay, delay of data information transmission, and even failure of an induction amplifier. On the other hand, the sub-threshold leakage current problem of the word lines and the transistors becomes increasingly serious, which will affect the performance and reliability of the device.

SUMMARY

The following is the summary of subject matters detailed in the present disclosure. The summary is not intended to limit the protection scope of the claims.

The embodiments of the present disclosure provide a semiconductor device and a manufacturing method thereof.

A method for manufacturing a semiconductor device according to the embodiments of the present disclosure comprises: providing a semiconductor substrate, with a plurality of trench isolation structures and a plurality of functional regions between the trench isolation structures being formed; forming a buried bit line structure, the buried bit line structure being formed in the semiconductor substrate; and forming a word line structure and a plurality of active regions, the word line structures and the active regions being formed on a surface of the semiconductor substrate and located above the functional regions.

The embodiments of the present disclosure further provide a semiconductor device, comprising: a semiconductor substrate, with a plurality of trench isolation structures and a plurality of functional regions between the trench isolation structures being formed; a plurality of buried bit line structures, being arranged in the semiconductor substrate; a plurality of word line structures and a plurality of source-drain structures, being arranged on a surface of the semiconductor substrate and located above the functional regions.

BRIEF DESCRIPTION OF THE DRAWINGS

The accompanying drawings incorporated into the description and constituting a part of the description illustrate the embodiments of the present disclosure, and are used together with the description to explain the principles of the embodiments of the present disclosure. In these drawings, similar reference numerals are used to indicate similar elements. The drawings in the following description are some embodiments of the present disclosure, but not all embodiments. For those of ordinary skill in the art, other drawings may be obtained based on these drawings without any creative efforts.

DETAILED DESCRIPTION

In order to make the objectives, technical solutions and advantages of the present disclosure clearer, the following clearly and completely describes the technical solutions in the embodiments of the present disclosure with reference to the accompanying drawings in the embodiments of the present disclosure. Apparently, the described embodiments are only part of the embodiments of the present disclosure, not all of them. All other embodiments obtained by those skilled in the art based on the embodiments of the present disclosure without any creative efforts shall fall within the protection scope of the present disclosure. It should be noted that the embodiments in the present disclosure and the features in the embodiments may be combined with each other on a non-conflict basis.

Hereinafter, a semiconductor device and a manufacturing method thereof provided in the present disclosure will be further described in detail with reference to the accompanying drawings and specific embodiments.

A method for manufacturing a semiconductor device 100 according to an embodiment of the present disclosure will be described below with reference to the accompanying drawings.

Figure 1:
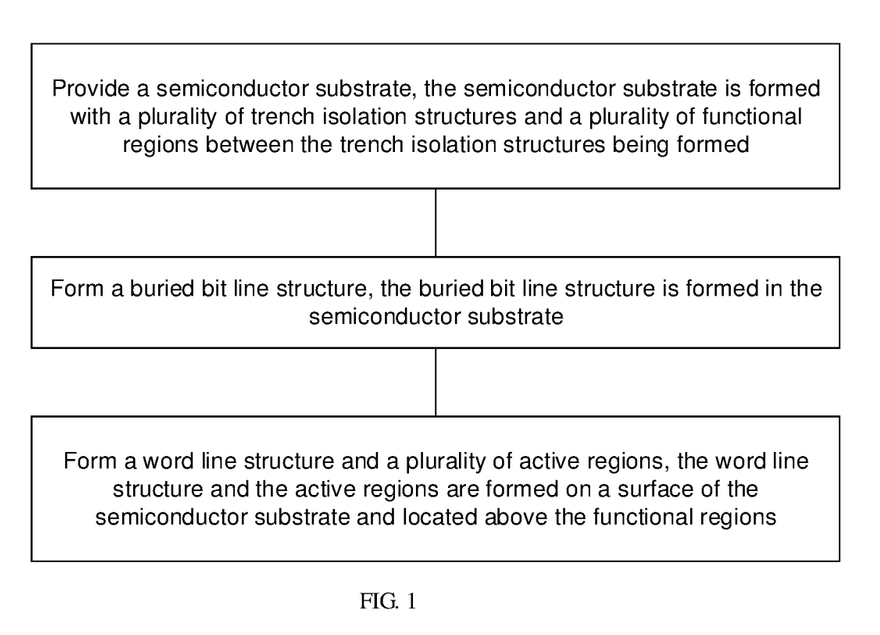
FIG. 1 is a flowchart of a method for manufacturing a semiconductor device according to an embodiment of the present disclosure.

As shown in FIG. 1, a method for manufacturing a semiconductor device 100 according to an embodiment of the present disclosure may comprise: providing a semiconductor substrate 1, the semiconductor substrate 1 being formed with a plurality of trench isolation structures 11 and a plurality of functional regions 12 between the trench isolation structures 11 being formed; forming a buried bit line structure 2, the buried bit line structure 2 being formed in the semiconductor substrate 1; and forming a word line structure 3 and a plurality of active regions, the word line structure 3 and the active regions being formed on a surface of the semiconductor substrate 1 and located above the functional regions 12.

FIGS. 2 to 20 are cross-sectional views of structures formed in various steps of the method for manufacturing a semiconductor device 100 according to the embodiment of the present disclosure. The process of the manufacturing method according to the embodiment of the present disclosure will be described in conjunction with the cross-sectional views of the structures formed in various step shown in FIGS. 2 to 20.

Figure 2:
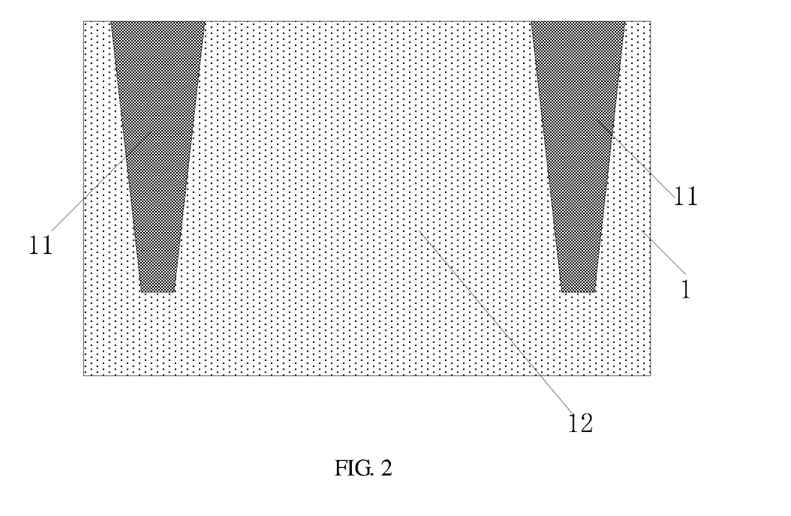
FIGS. 2 to 20 are cross-sectional views of structures formed in various steps of the method for manufacturing a semiconductor device according to embodiments of the present disclosure.

As shown in FIG. 2, a semiconductor substrate 1 is provided. The material of the semiconductor substrate 1 may be silicon (Si), germanium (Ge), silicon germanium (GeSi), or silicon carbide (SiC); the material can also be silicon on insulator (SOI) or germanium on insulator (GOI); or the material can also be other material, for example, a group III-V compound such as gallium arsenide. The semiconductor substrate 1 is formed with a plurality of trench isolation structures 11 and a plurality of functional regionsl 2 between the trench isolation structures 11 being formed. The trench isolation structures 11 isolate a plurality of functional regions 12 in the semiconductor substrate 1, the trench isolation structure 11 may comprise an isolation trench and an insulating material filled in the isolation trench, and the insulating material may be silicon oxide or the like.

Figure 3:
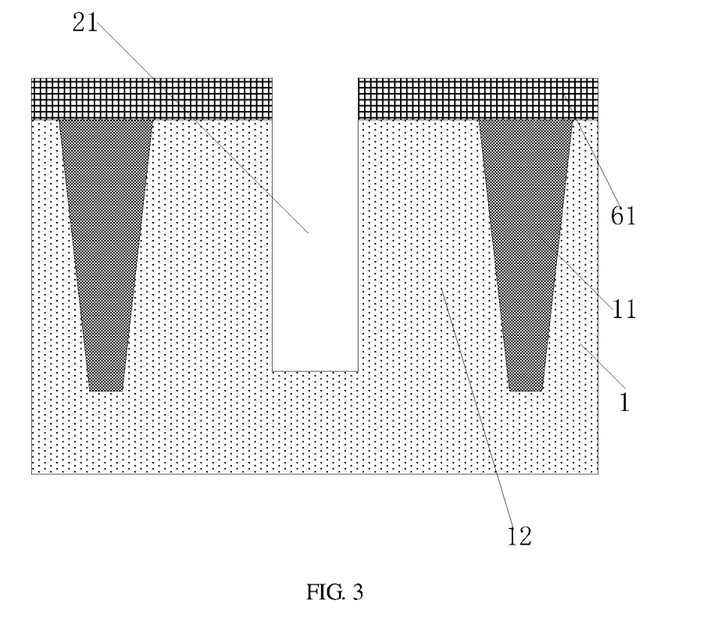
Figure 4:
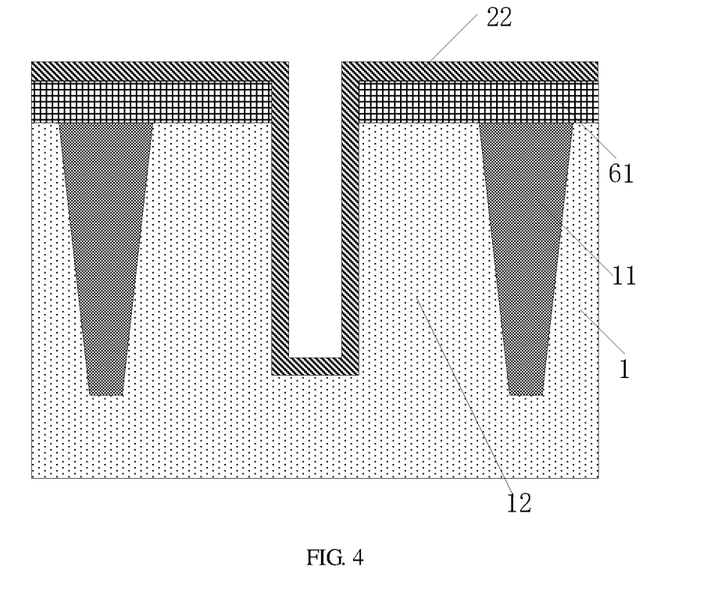
Figure 5:
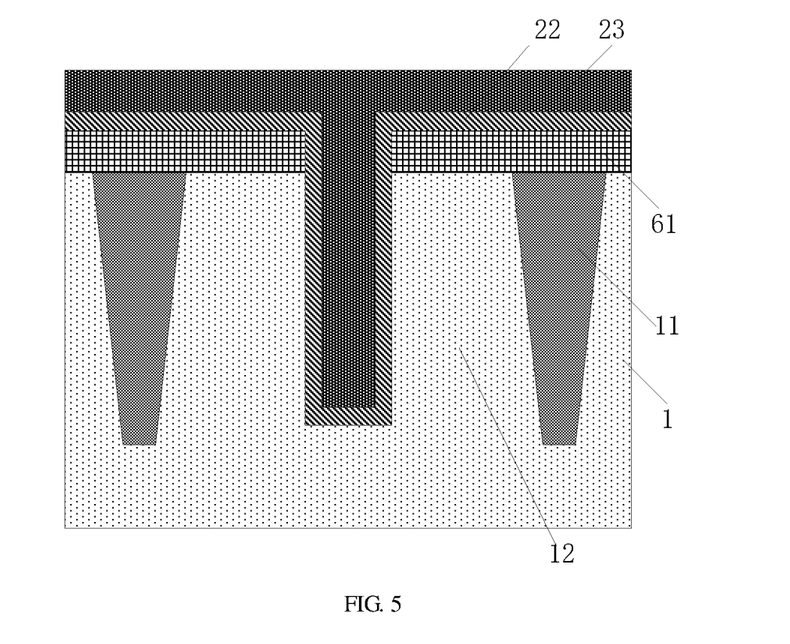
Figure 6:
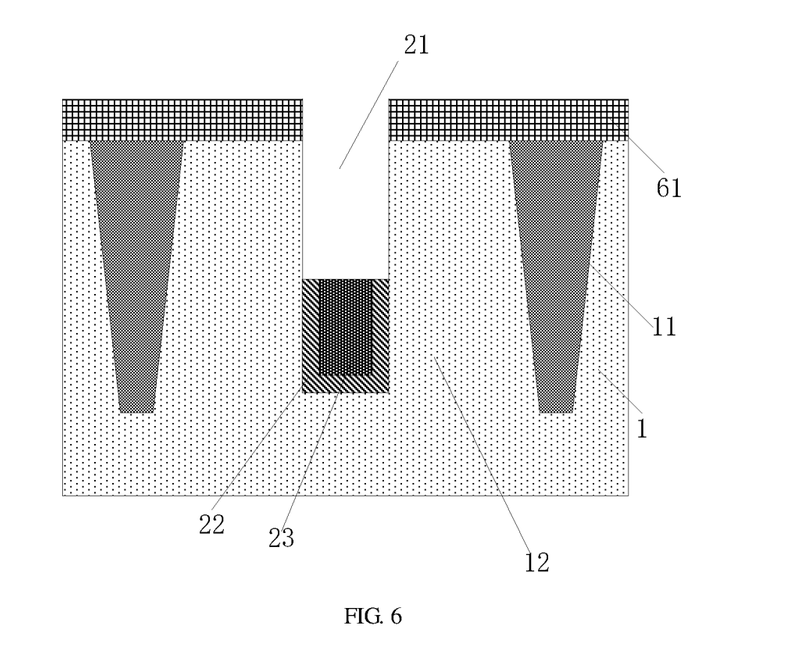

As shown in FIGS. 3 to 8, a buried bit line structure 2 is formed. The buried bit line structure 2 is formed in the semiconductor substrate 1. The buried bit line structure 2 is formed by the following steps: as shown in FIG. 3, an insulation trench 21 is formed in the semiconductor substrate 1; as shown in FIGS. 4-6, a bit line barrier layer 22 covering a bottom wall and a part of side walls of the insulation trench 21 is formed in the insulation trench 21; and a bit line conductive layer 23 is formed on a surface of the bit line barrier layer 22 and fills a part of the insulation trench 21.

Referring to FIG. 3, a first mask layer 61 is deposited and formed on the surface of the semiconductor substrate 1, and the semiconductor substrate 1 is patterned with the first mask layer 61 as a mask. The insulation trench 21 is formed in the semiconductor substrate 1, the insulation trench 21 is formed in the functional region 12 between the trench isolation structures 11, and the buried bit line structure 2 is formed in the insulation trench 21, wherein the insulation trench 21 may have a depth of 60 nm to 150 nm, for example, 80 nm, 100 nm, 120 nm, etc., and the insulation trench 21 may have a width of 10 nm to 60 nm, for example, 20 nm, 30 nm, 40 nm or 50 nm, etc.

As shown in FIG. 4, the bit line barrier layer 22 is formed on a surface of the first mask layer 61 and the inner wall surface of the insulation trench 21. The bit line barrier layer 22 may be formed by atomic layer deposition, the material of the bit line barrier layer 22 may be TiN (titanium nitride), and the bit line barrier layer 22 may have a thickness of 3 nm to 8 nm, for example, 4 nm, 5 nm, 6 nm or 7 nm, etc.

As shown in FIG. 5, the bit line conductive layer 23 is formed on a surface of the bit line barrier layer 22. At this time, the bit line barrier layer 22 and the bit line conductive layer 23 fill up the insulation trench 21, and the bit line barrier layer 22 located in the insulation trench 21 wraps the bit line conductive layer 23. The material of the bit line conductive layer 23 may be a tungsten material, and the bit line conductive layer 23 may be formed by chemical vapor deposition or physical vapor deposition. After the deposition, a surface of the bit line conductive layer 23 may be processed by using a chemical mechanical polishing device, so that the surface of the bit line conductive layer 23 is flat.

As shown in FIG. 6, part of the bit line barrier layer 22 and part of the bit line conductive layer 23 above the first mask layer 61 are removed, part of the bit line conductive layer 23 and part of the bit line conductive layer 23 in the insulation trench 21 are removed, part of the bit line barrier layer 22 and part of the bit line conductive layer 23 at the lower part of the insulation trench 21 are reserved, and the bit line barrier layer 22 and the bit line conductive layer 23 in the insulation trench 21 may be etched back by a depth of 30 nm to 120 nm. The process for etching the bit line barrier layer 22 and the bit line conductive layer 23 back comprises: the bit line barrier layer 22 and the bit line conductive layer 23 may be etched back by dry etching, and the residual bit line barrier layer 22 on the dry etched side walls is removed by wet etching. The surface of the residual bit line barrier layer 22 is flush with a surface of the bit line conductive layer 23 and wraps the bit line conductive layer 23 to avoid ion migration occurring on the bit line conductive layer 23 and achieve a blocking and isolation effect.

Figure 7:
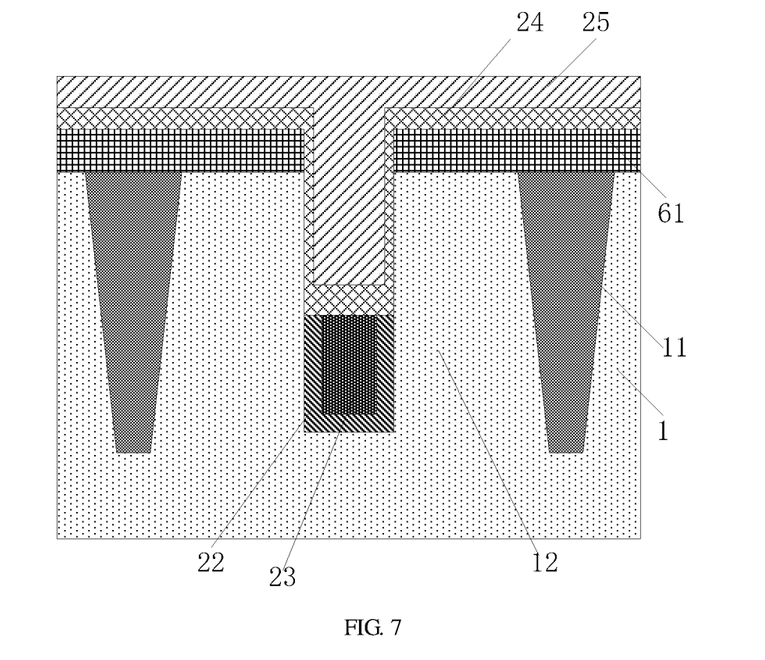

As shown in FIG. 7, an isolation layer 24 is deposited on a surface of the first mask layer 61, an inner wall surface of the insulation trench 21, and a surface of the bit line barrier layer 22 and a surface of the bit line conductive layer 23, and a polysilicon layer 25 is formed on a surface of the isolation layer 24 and fills the insulation trench 21. The material of the isolation layer 24 may be a cobalt material or a titanium material, the isolation layer 24 may be deposited by physical vapor deposition, then the polysilicon layer 25 is deposited by chemical vapor deposition, and a surface of the polysilicon layer 25 is flattened by chemical mechanical polishing.

Figure 8:
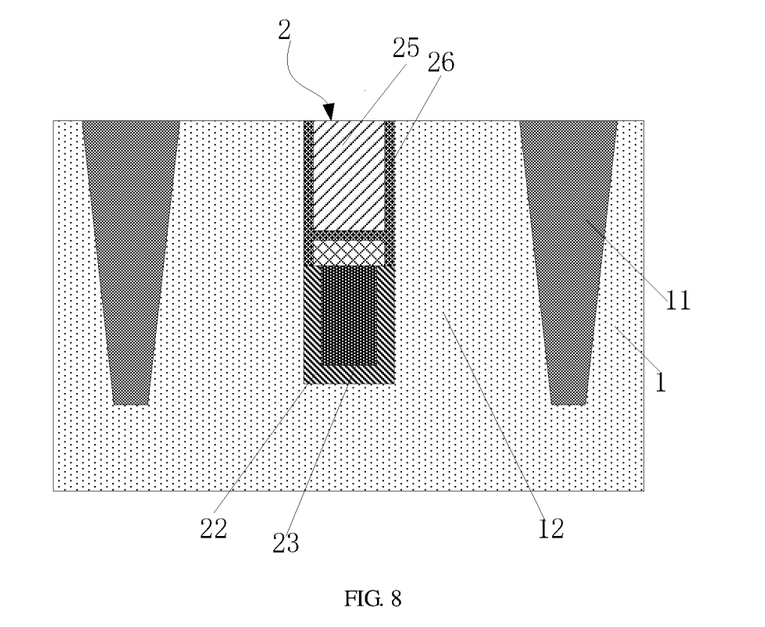

As shown in FIG. 8, the polysilicon layer 25 may be doped with an element. For example, the polysilicon layer 25 may be doped with a P element, which can increase the conductivity of the polysilicon layer 25 and improve the electrical connection effect of the buried bit line structure 2. As shown in FIG. 8, the polysilicon layer 25, the isolation layer 24 and the first mask layer 61 on the surface of the semiconductor substrate 1 may be removed, part of the polysilicon layer 25 and part of the isolation layer 24 in the insulation trench 21 are reserved, and the surface of the isolation layer 24 and the polysilicon layer 25 are flush with the surface of the semiconductor substrate 1.

In some embodiments of the present disclosure, the polysilicon layer 25, the isolation layer 24 and the first mask layer 61 on the surface of the semiconductor substrate 1 are removed by etching, and the residual etching by-products on the surface of the semiconductor substrate 1 are removed by wet cleaning. Then, a rapid heat treatment may be performed, so that the part of the isolation layer 24 in contact with the semiconductor substrate 1 reacts to form a contact layer 26. The material of the contact layer 26 formed after the reaction may be a silicon-cobalt compound $CoSi_x$ or a silicon-titanium compound $TiSi_x$, thereby forming an ohmic contact. Therefore, on the one hand, the contact resistance between the bit line conductive layer 23 and the polysilicon layer 25 may be reduced. On the other hand, the silicon-cobalt compound $CoSi_x$ or the silicon-titanium compound $TiSi_x$ on the contact layer 26 formed on the side walls can also prevent the ion implantation element P from diffusing into the functional region 12.

Figure 9:
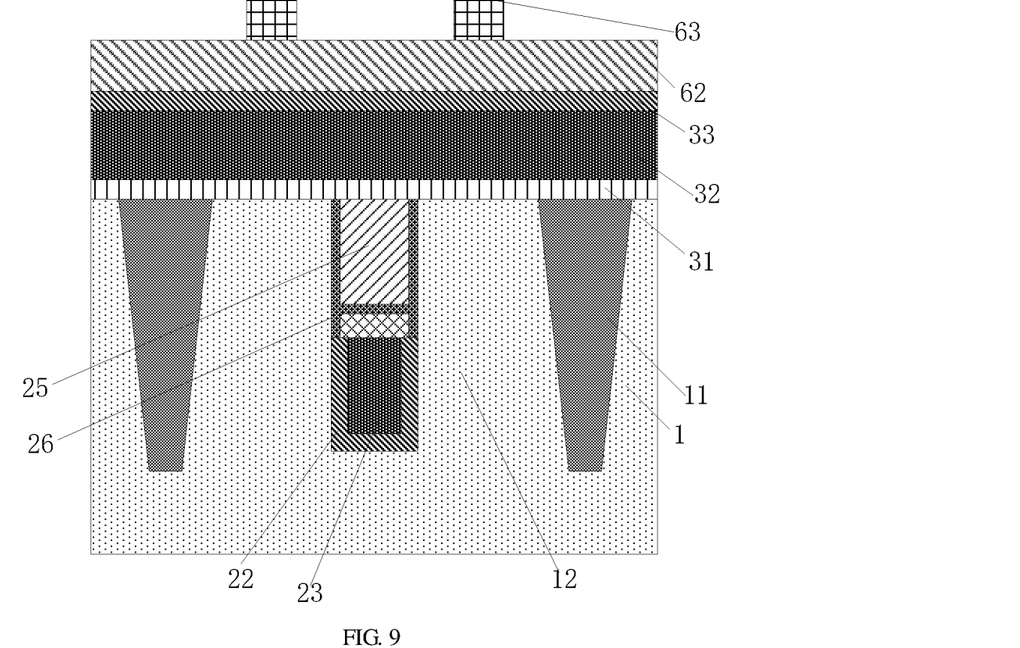
Figure 10:
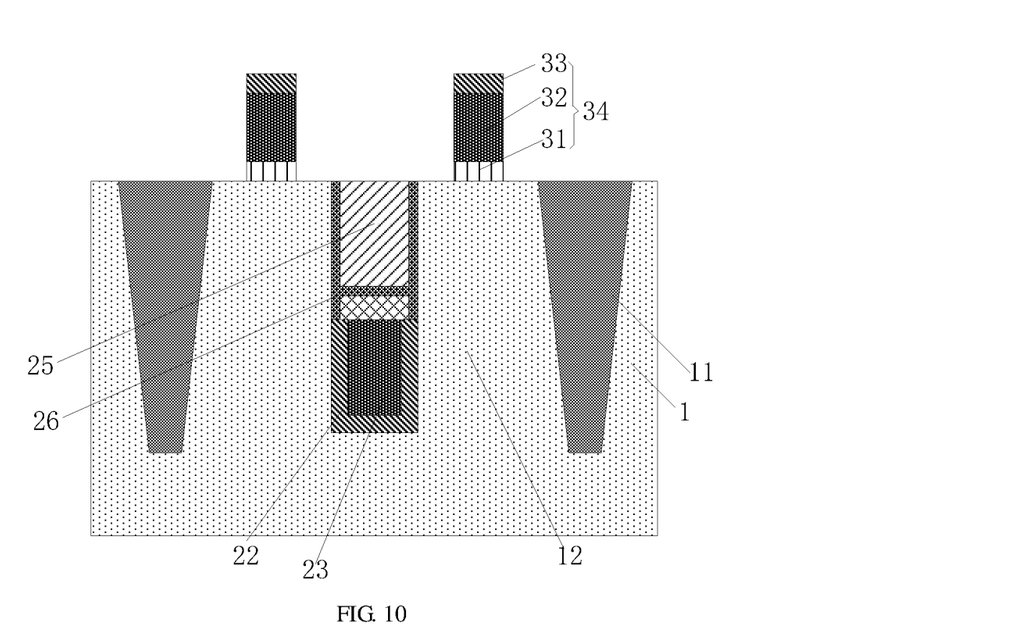
Figure 11:
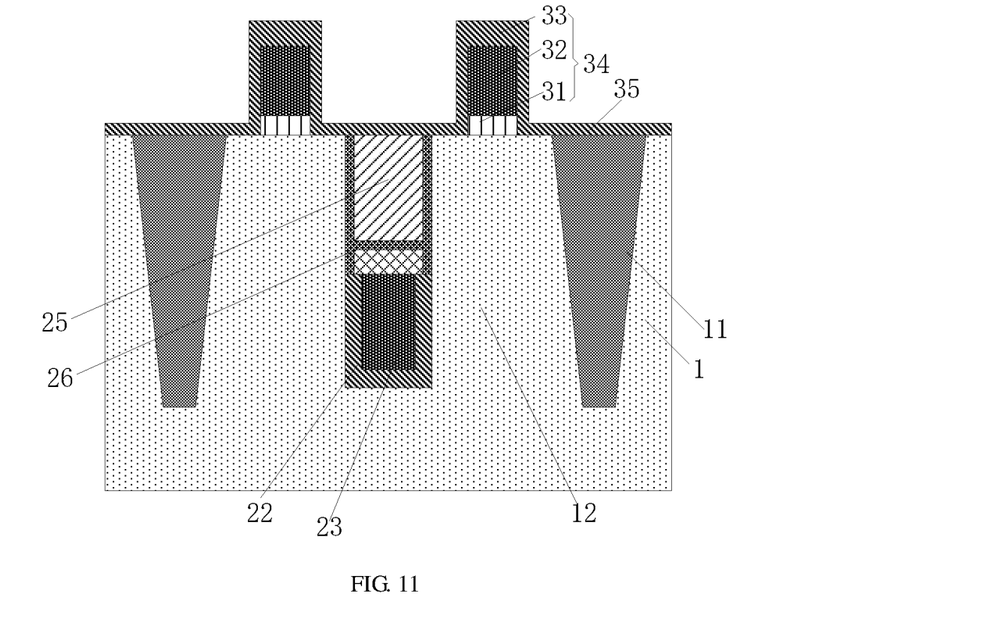
Figure 12:
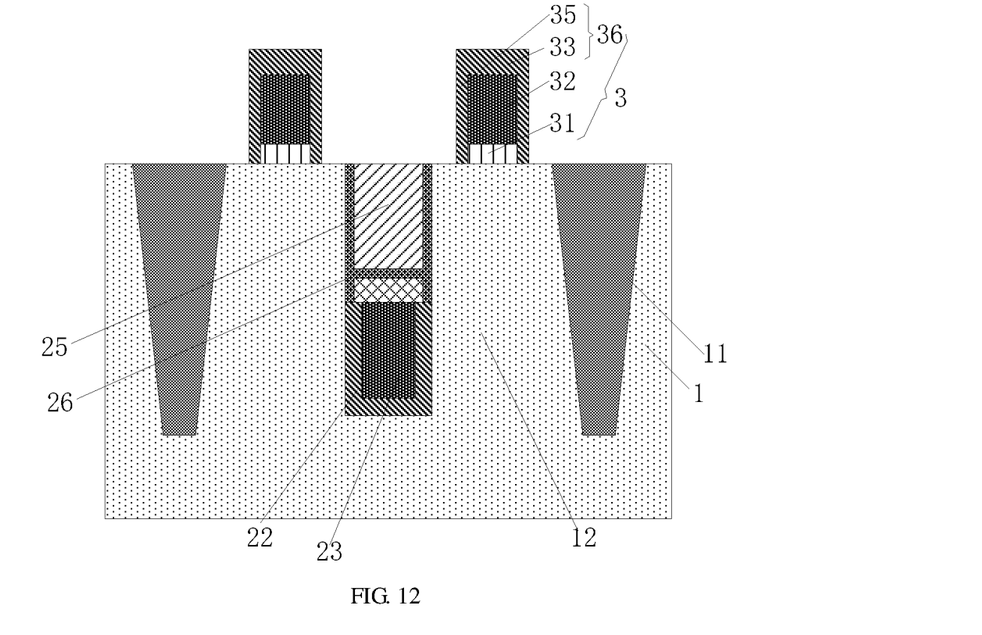

FIGS. 9-13 are cross-sectional views of structures formed by various steps of a process for forming a word line structure 3 and an active region on the surface of the semiconductor substrate 1. The word line structure 3 is formed by the following steps: as shown in FIG. 9, a multi-layer structure is formed on the surface of the semiconductor substrate 1, the multi-layer structure comprising a passivation layer 31, a word line conductive layer 32 and a top word line barrier layer 33 stacked in sequence; as shown in FIG. 11, the multi-layer structure is patterned to form a primary word line structure pattern 34; and as shown in FIG. 12, side word line barrier layers 35 are formed on side walls of the primary word line structure pattern 34, wherein the side word line barrier layers 35 and the top word line barrier layer 33 together form a word line barrier layer 36, and the passivation layer 31, the word line conductive layer 32 and the word line barrier layer 36 together form the word line structure 3.

Referring to FIG. 9, the multi-layer structure is formed on the surface of the semiconductor substrate 1. In the upward direction from the surface of the semiconductor substrate 1, the multi-layer structure comprises the passivation layer 31, the word line conductive layer 32 and the top word line barrier layer 33 in sequence. A mask structure is formed on a surface of the top word line barrier layer 33. As shown in FIG. 10, the multi-layer structure is patterned through the mask structure to form the preliminary word line structure pattern.

In some embodiments of the present disclosure, as shown in FIG. 10, the mask structure may comprise a second mask layer 62 formed on the surface of the top word line barrier layer 33 and a third mask layer 63 formed on a surface of the second mask layer 62 to form a word line pattern. Specifically, the word line pattern may be formed on the third mask layer 63 by a spacing multiplication technology after film deposition. The second mask layer 62 may be formed as an organic carbon layer, the third mask layer 63 may be formed as a hard mask layer, and the material of the third mask layer 63 may be a silicon oxide material.

As shown in FIG. 11, the side word line barrier layers 35 are deposited on the side wall surface of the primary word line structure pattern 34 and the surface of the semiconductor substrate 1. The side word line barrier layers 35 and the top word line barrier layer 33 are of the same material, for example, the side word line barrier layers 35 and the top word line barrier layer 33 may be of a titanium nitride material. The side word line barrier layers 35 may be deposited by atomic layer deposition.

As shown in FIG. 12, an etching process such as dry etching is adopted to remove part of the side word line barrier layers 35 on the surface of the semiconductor substrate 1 and reserve the side word line barrier layers 35 on the side walls of the primary word line structure pattern 34, so as to form the word line barrier layer 36 together with the top word line barrier layer 33, the word line barrier layer 36 may have a thickness of 2 nm to 7 nm, the word line barrier layer 36 wraps the passivation layer 31 and the word line conductive layer 32, and the passivation layer 31, the word line conductive layer 32 and the word line barrier layer 36 together form the word line structure 3.

Figure 13:
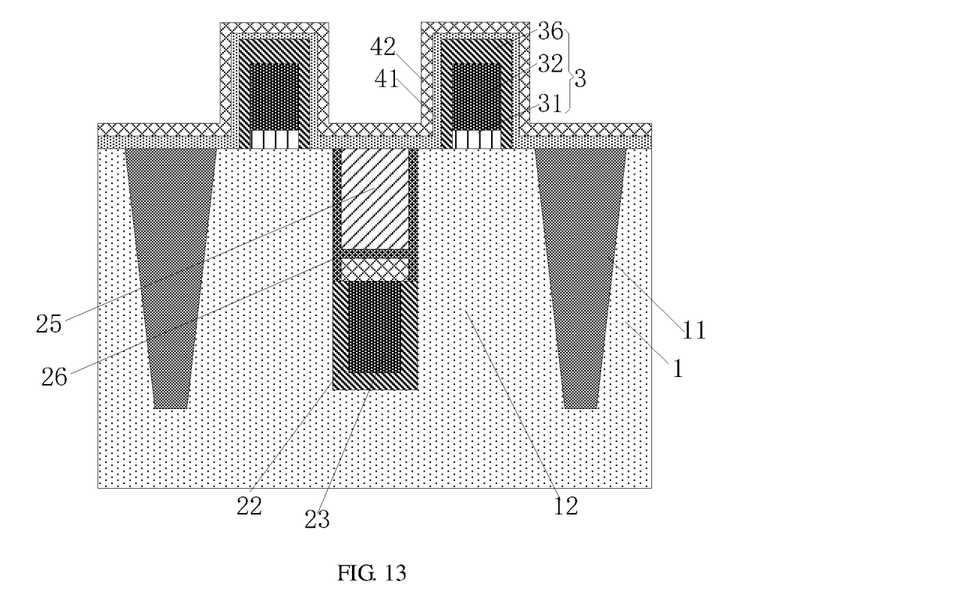

As shown in FIG. 13, a primary dielectric layer 41 is formed on the surface of the semiconductor substrate 1 and a surface of the word line structure 3, and a primary channel layer 42 is formed on a surface of the primary dielectric layer 41. The primary dielectric layer 41 may be formed by deposition (for example, atomic layer deposition), and then the primary channel layer 42 is formed by low pressure vapor deposition (for example, physical vapor deposition or chemical vapor deposition). The material of the primary dielectric layer 41 may be a high dielectric material such as hafnium dioxide ($HfO_2$), the material of the primary channel layer 42 may be a silicon material, and the primary channel layer 42 has a thickness of 2 nm to 10 nm.

Figure 14:
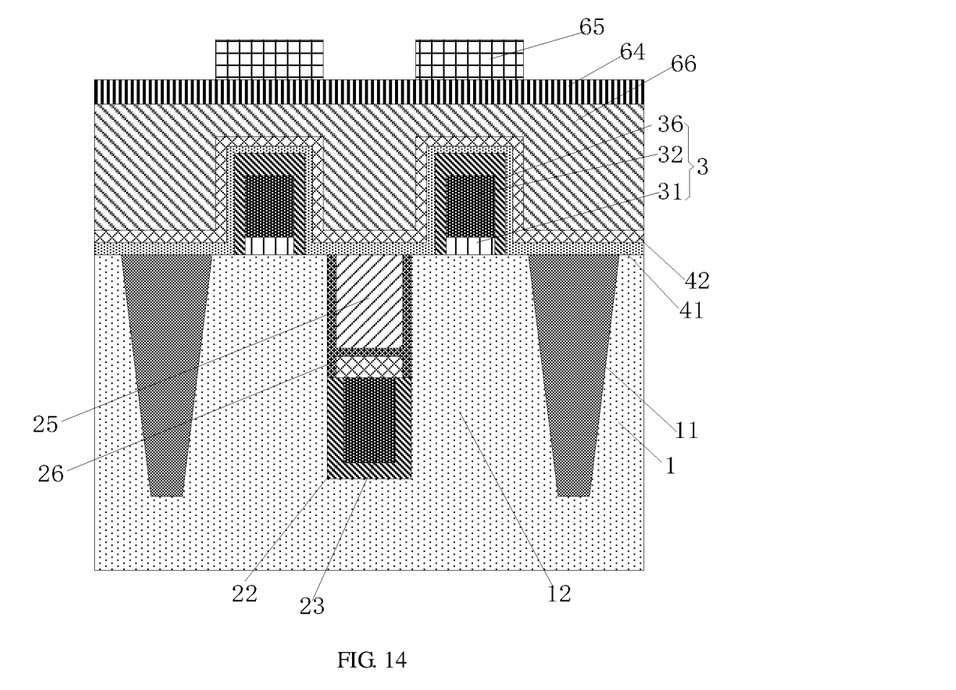
Figure 15:
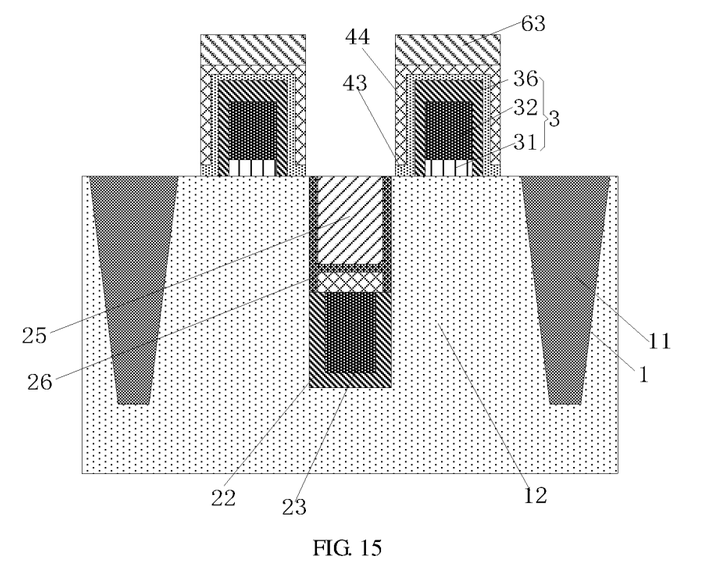
Figure 16:
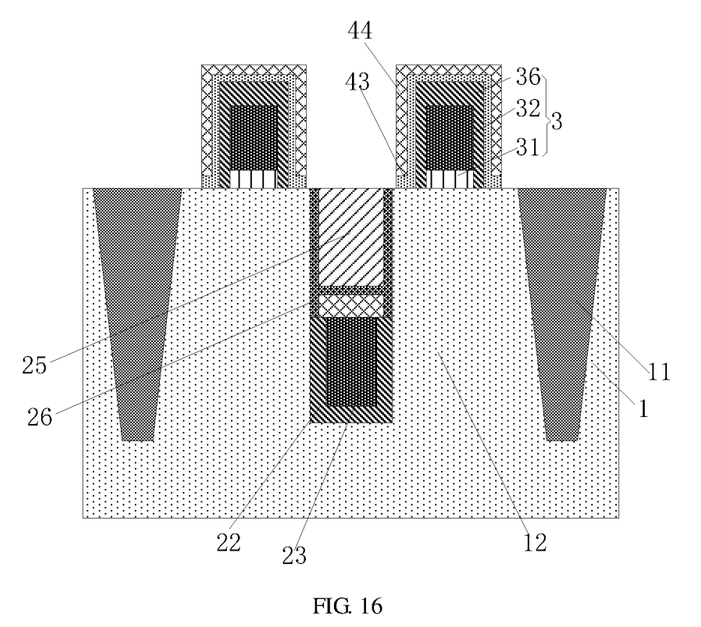

As shown in FIGS. 14-16, a part of the primary dielectric layer 41 and a part of the primary channel layer 42 on the surface of the semiconductor substrate 1 are removed, and a rest part of the primary dielectric layer 41 and a rest part of the primary channel layer 42 on a top and side walls of the word line structure 3 are reserved to form a dielectric layer 43 and a channel layer 44. The dielectric layer 43 covers the word line structure 3, and the channel layer 44 covers the dielectric layer 43.

Referring to FIG. 14, a filling layer 66 is formed on a surface of the primary channel layer 42. The filling layer 66 fills up the primary channel layer 42 and a surface of the filling layer 66 is higher than the surface of the primary channel layer 42. A fourth mask layer 64 is deposited on the surface of the filling layer 66, and a surface of the fourth mask layer 64 is coated with a photoresist to form a photoresist layer 65. The filling layer 66 is backfilled by film deposition, the filling layer 66 may be an organic carbon layer, and the fourth mask layer 64 may be formed as a silicon oxynitride hard mask layer. The filling layer 66, the primary channel layer 42 and the primary dielectric layer 41 are patterned by coating, exposing, and developing.

As shown in FIG. 15, a part of the primary channel layer 42 and a part of the primary dielectric layer 41 on the surface of the semiconductor substrate 1 are removed, and a rest part of the primary channel layer 42 and a rest part of the primary dielectric layer 41 on the side walls of the word line structure 3 are reserved to form the dielectric layer 43 and the channel layer 44 of the word line structure 3. The channel layer 44 is formed on a surface of the dielectric layer 43, and the side walls of the bottom part of the dielectric layer 43 formed on the surface of the semiconductor substrate 1 are flush with the side walls of the channel layer 44. In this step, a stop layer may be formed on the surface of the semiconductor substrate 1 by dry etching. After the etching, a surface of the channel layer 44 has the partially residual filling layer 66. As shown in FIG. 16, the residual filling layer 66 on the surface of the channel layer 44 is removed. For example, the residual filling layer 66 may be removed by a plasma bath with hydrogen, oxygen, or a mixed gas of hydrogen and oxygen.

Figure 17:
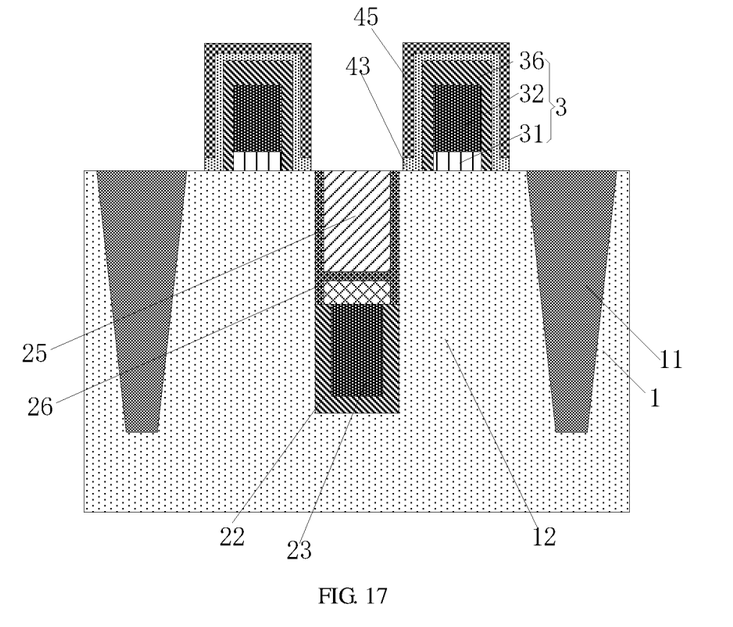

As shown in FIG. 17, ion implantation is performed on the channel layer 44 to form a gate channel 45. Specifically, the type of implanted atoms may be selected according to different device requirements. For example, an N element such as phosphorus atoms or arsenic atoms, or a P element such as boron atoms, may be implanted, with low energy (such as 1 k to 15 k) and low dose (such as 0.5 to 10 E13).

Figure 18:
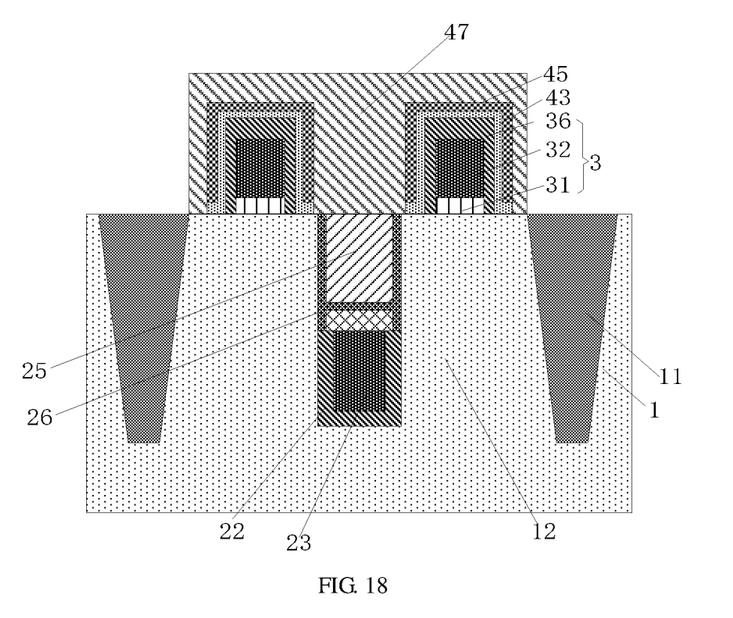
Figure 19:
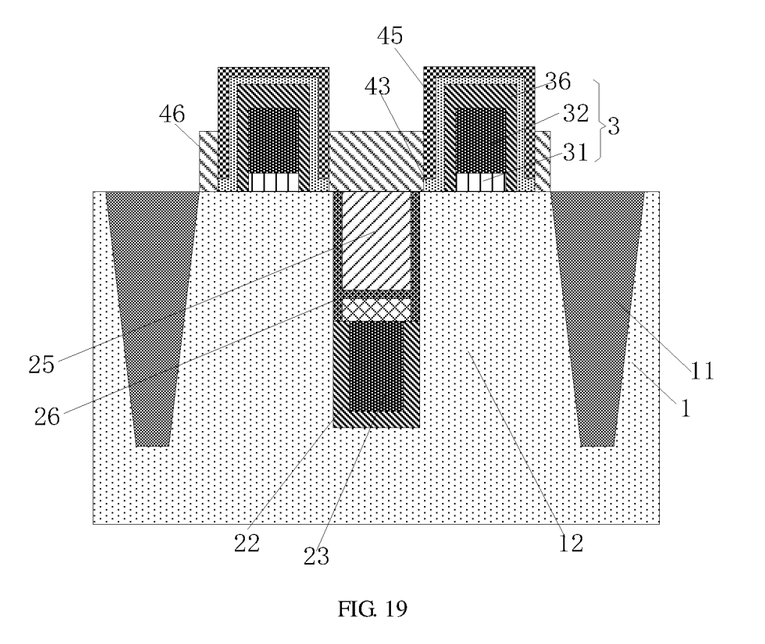
Figure 20:
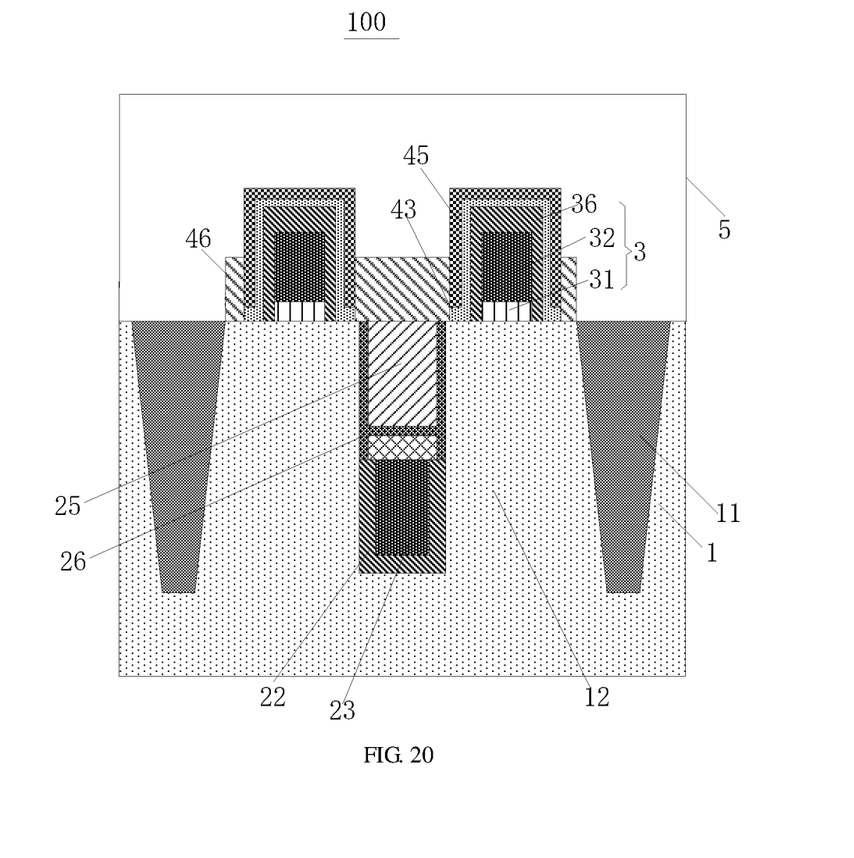

As shown in FIGS. 18-20, an active region is formed on the surface of the semiconductor substrate 1 and located above the functional region 12. The active region is formed by forming a source-drain structure 46 on the surface of the semiconductor substrate 1 and above the functional region 12 as the active region, comprising the following steps:

As shown in FIG. 18, a source-drain layer 47 covering a surface of the gate channel is filled between the surface of the semiconductor substrate 1 and the gate channel 45. The source-drain layer 47 is epitaxially formed on the surface of the semiconductor substrate 1 and the surface of the gate channel 45 by using a molecular epitaxy technology. Further, the source-drain layer 47 may be epitaxially produced as a SiGe layer or a SiC layer according to the requirements of different MOS (metal-oxide-semiconductor) devices. The source-drain layer 47 is doped in situ while the source-drain layer 47 is formed, or the source-drain layer 47 is implanted with ions after the source-drain layer 47 is formed.

As shown in FIG. 19, the source-drain layer 47 above the gate channel 45 and the source-drain layer 47 partially on the side walls of the word line channel are removed to form the source-drain structure 46. The word line channel comprises the dielectric layer 43 and the gate channel 45. In this step, part of the source-drain layer 47 may be selectively removed and part of the source-drain layer 47 may be reserved by wet etching or dry etching to form a drain-source region. The drain-source region may comprise a drain region and a source region. The source region is connected to the embedded bit line structure 2, and is formed between the adjacent gate channels 45 and located above the buried bit line structure 2. The drain region is formed on the other side of the word line structure 3. The thickness of the finally reserved source-drain layer 47, that is, the source-drain structure 46, may be 30 to 100 nm.

In another embodiment, the source-drain structure 46 may be partially located above the trench isolation structure 11, and a source-drain isolation structure (not shown) is formed between the adjacent source-drain structures 46 to isolate each memory cell device. The material of the source-drain isolation structure (not shown) may be one or more of spin-on dielectric (SOD), tetraethyl orthosilicate (TEOS), silicon nitride (SiN) and silicon oxynitride (SiON).

As shown in FIG. 20, an insulating layer 5 covering the source-drain region and the surface of the gate channel 45 is deposited on the surface of the semiconductor substrate 1. The formed insulating layer 5 can protect the structure of the semiconductor device 100, and the insulating layer 5 formed above the gate channel 45 can also greatly reduce leakage current in the direction of the substrate and enhance the reliability of the semiconductor device 100. The material of the insulating layer 5 may be one or more of spin-on dielectric (SOD), tetraethyl orthosilicate (TEOS), silicon nitride (SiN) and silicon oxynitride (SiON).

Therefore, in the method for manufacturing a semiconductor device 100 according to the embodiments of the present disclosure, buried bit line structures 2 are formed in a semiconductor substrate 1, word line structures 3 and source-drain structures 46 are formed above the semiconductor substrate 1, and capacitors are subsequently formed on two sides of the source-drain structures 46, so that distances between the buried bit line structures 2 and the subsequently formed capacitors are increased, which reduces leakage current between the buried bit line structures 2 and the capacitors, also reduces the parasitic capacitance effect between the buried bit line structures 2 and the capacitors, and improves the performance and reliability of the semiconductor device 100.

The present disclosure further provides a semiconductor device 100. The semiconductor device 100 may be formed by the method for manufacturing a semiconductor device according to the above embodiment.

The semiconductor device 100 according to the embodiment of the present disclosure comprises: a semiconductor substrate 1, with a plurality of trench isolation structures 11 and a plurality of functional regions 12 between the trench isolation structures 11 being formed; a plurality of buried bit line structures 2, being arranged in the semiconductor substrate 1; a plurality of word line structures 3 and a plurality of source-drain structures 46, the word line structures 3 and the source-drain structures 46 being arranged on a surface of the semiconductor substrate 1 and located above the functional regions 12.

According to some embodiments of the present disclosure, the semiconductor device 100 further comprises a channel layer 44 and a dielectric layer 43, the dielectric layer 43 is configured to cover at least a surface of the word line structures 3, and the channel layer 44 is configured to cover a surface of the dielectric layer 43.

According to some embodiments of the present disclosure, the source-drain structures 46 are arranged above the functional regions 12 and on sides of the channel layer 44 and the dielectric layer 43.

The source-drain structures 46 have a thickness of 30 nm to 100 nm.

The semiconductor device manufactured by the method for manufacturing a semiconductor device according to the present disclosure can reduce leakage current and reduce the parasitic capacitance effect between bit line structures and capacitors, and has good performance and high reliability.

A person skilled in the art would readily conceive of other embodiments of the present disclosure after considering the disclosure of the description and practice. The present disclosure is intended to cover any variations, uses or adaptive changes of the present disclosure. These variations, uses or adaptive changes follow the general principle of the present disclosure and comprise common general knowledge or conventional technical means in the technical field that are not disclosed in the present disclosure. The description and the embodiments are merely regarded as exemplary, and the real scope and spirit of the present disclosure are pointed out by the following claims.

It should be understood that the present disclosure is not limited to the precise structure described above and shown in the drawings, and various modifications and changes may be made without departing from its scope. The scope of the present disclosure is only limited by the appended claims.

INDUSTRIAL APPLICABILITY

The present disclosure provides a semiconductor device and a manufacturing method thereof. The method for manufacturing a semiconductor device comprises: providing a semiconductor substrate formed with a plurality of trench isolation structures and a plurality of functional regions between the trench isolation structures being formed; forming buried bit line structures; and forming word line structures and a plurality of active regions. The semiconductor device manufactured according to the method for manufacturing a semiconductor device can reduce leakage current and reduce the parasitic capacitance effect between bit line structures and capacitors, and has good performance and high reliability.

The invention claimed is:

1. A method for manufacturing a semiconductor device, comprising:
   providing a semiconductor substrate, with a plurality of trench isolation structures and a plurality of functional regions between the trench isolation structures being formed;
   forming a buried bit line structure, the buried bit line structure being formed in the semiconductor substrate; and
   forming a word line structure and a plurality of active regions, the word line structure and the active regions being formed on a surface of the semiconductor substrate and located above the functional regions;
   wherein the forming a word line structure comprises:
      forming a multi-layer structure on the surface of the semiconductor substrate, the multi-layer structure comprising a passivation layer, a word line conductive layer and a top word line barrier layer stacked in sequence;
      patterning the multi-layer structure to form a primary word line structure pattern; and
      forming side word line barrier layers on side walls of the primary word line structure pattern, wherein the side word line barrier layers and the top word line barrier layer together form a word line barrier layer, and the passivation layer, the word line conductive layer and the word line barrier layer together form the word line structure.

2. The method for manufacturing a semiconductor device according to claim 1, further comprising:
   forming a dielectric layer on a surface of the word line structure; and
   forming a channel layer on a surface of the dielectric layer;
   wherein, the dielectric layer covers the word line structure, and the channel layer covers the dielectric layer.

3. The method for manufacturing a semiconductor device according to claim 2, wherein the forming a dielectric layer on a surface of the word line structure and forming a channel layer on a surface of the dielectric layer comprise:
   forming a primary dielectric layer on the surface of the semiconductor substrate and the surface of the word line structure;
   forming a primary channel layer on a surface of the primary dielectric layer; and
   removing a part of the primary dielectric layer and a part of the primary channel layer on the surface of the semiconductor substrate, and reserving a rest part of the primary dielectric layer and a rest part of the primary channel layer on a top and side walls of the word line structure, to form the dielectric layer and the channel layer.

4. The method for manufacturing a semiconductor device according to claim 2, further comprising: performing ion implantation on the channel layer to form a gate channel.

5. The method for manufacturing a semiconductor device according to claim 4, wherein the forming an active region comprises: forming a source-drain structure above the functional region on the surface of the semiconductor substrate as the active region.

6. The method for manufacturing a semiconductor device according to claim 5, wherein the forming a source-drain structure above the functional region on the surface of the semiconductor substrate comprises:
   forming a source-drain layer covering a surface of the gate channel, between the surface of the semiconductor substrate and the gate channel; and
   removing the source-drain layer above the gate channel and removing the source-drain layer on a part of side walls of a word line channel, to form the source-drain structure, the word line channel comprising the dielectric layer and the gate channel.

7. The method for manufacturing a semiconductor device according to claim 6, wherein the forming a source-drain layer covering a surface of the gate channel, between the surface of the semiconductor substrate and the gate channel comprises:
   forming the source-drain layer by a molecular epitaxy process; and
   performing in-situ doping on the source-drain layer while forming the source-drain layer, or performing ion implantation on the source-drain layer after forming the source-drain layer.

8. The method for manufacturing a semiconductor device according to claim 5, wherein the source-drain structure has a height of 30 nm to 100 nm.

9. The method for manufacturing a semiconductor device according to claim 1, wherein the forming a buried bit line structure comprises:
   forming an insulation trench in the semiconductor substrate;
   forming a bit line barrier layer in the insulation trench to cover a bottom wall and a part of side walls of the insulation trench; and
   forming a bit line conductive layer on a surface of the bit line barrier layer and filling a part of the insulation trench.

10. The method for manufacturing a semiconductor device according to claim 9, further comprising:
   forming an isolation layer on a surface of the bit line barrier layer, a surface of the bit line conductive layer, and side walls of the insulation trench; and
   forming a polysilicon layer on a surface of the isolation layer and filling the insulation trench.

11. The method for manufacturing a semiconductor device according to claim 10, wherein after forming a polysilicon layer on a surface of the isolation layer and filling the insulation trench, executing: performing rapid heat treatment on the isolation layer.

12. The method for manufacturing a semiconductor device according to claim 10, wherein a material of the isolation layer is cobalt or titanium.

* * * * *